United States Patent [19]

Iseda et al.

[11] Patent Number: 5,091,955
[45] Date of Patent: Feb. 25, 1992

[54] VOICE CODING/DECODING SYSTEM HAVING SELECTED CODERS AND ENTROPY CODERS

[75] Inventors: Kohei Iseda, Kawasaki; Kazumi Satoh, Yokohama; Hideaki Kurihara, Kawasaki; Fumio Amano, Tokyo; Shigeyuki Unagami, Atsugi; Koji Okazaki, Kawasaki, all of Japan

[73] Assignee: Fujitsu Limited, Kawasaki, Japan

[21] Appl. No.: 545,499

[22] Filed: Jun. 29, 1990

[30] Foreign Application Priority Data

Jun. 29, 1989 [JP] Japan .................................. 1-167839
Oct. 13, 1989 [JP] Japan .................................. 1-265196

[51] Int. Cl.$^5$ .............................................. G10L 5/00
[52] U.S. Cl. ............................................ 381/36; 381/34
[58] Field of Search ............................... 381/29–40; 364/513.5; 375/25–27, 34, 122

[56] References Cited

U.S. PATENT DOCUMENTS

| | | | |
|---|---|---|---|
| 3,017,456 | 1/1962 | Schreiber | 381/31 |
| 3,598,921 | 8/1971 | Kleinrock | 381/35 |
| 4,303,803 | 12/1981 | Yatsuzuka | 381/31 |
| 4,534,055 | 8/1985 | Iinuma | 381/34 |
| 4,805,193 | 2/1989 | McLaughlin et al. | 381/29 |
| 4,918,729 | 4/1990 | Kudoh | 381/36 |
| 4,956,871 | 9/1990 | Swaminathan | 381/31 |

FOREIGN PATENT DOCUMENTS

| | | |
|---|---|---|
| 0164677 | 12/1985 | European Pat. Off. |
| 0238798 | 9/1988 | European Pat. Off. |
| 2162025 | 1/1986 | United Kingdom |

Primary Examiner—Dale M. Shaw
Assistant Examiner—Michelle Doerrler
Attorney, Agent, or Firm—Staas & Halsey

[57] ABSTRACT

Disclosed is a voice coding/decoding system having a transmitting part for transmitting a coded signal of an input voice signal at a bit rate lower than a predetermined transmission bit rate and a receiving part for receiving and decoding the coded signal transmitted from the transmission part. To enable the coding and transmitting of an input voice signal in an optimum state without passing through a buffer memory and without having a negative influence on the coder, the transmitting part provides coders for coding the input voice signal and groups of entropy coders. The inputs of the entropy coders in each group are connected to the output of one of the plurality of coders. The transmitting part further provides an evaluation part for evaluating the characteristics of the outputs of the coders and the entropy coders. The evaluation part extracts those entropy coders having output bit rates lower than the transmission bit rate and extracts, from the coders connected to the extracted entropy coders, a coder having the best output characteristic. Then, the evaluation part outputs a selecting signal indicating the combination of the selected coder and an entropy coder from the extracted entropy coders. The transmitting part further provides a selecting part for selecting, in response to the selecting signal, the codeword passed through the combination of the coder and the entropy coder to be transmitted.

59 Claims, 6 Drawing Sheets

VOICE CODING/DECODING SYSTEM HAVING SELECTED CODERS AND ENTROPY CODERS

BACKGROUND OF THE INVENTION

(1) Field of the Invention

The present invention relates to a voice coding/decoding system having a transmitting part for transmitting a coded signal of an input voice signal and a receiving part for receiving and decoding the coded signal transmitted from the transmission part, and more particularly, to a voice coding/decoding system that does not utilize a buffer memory.

In general, the transmission part has a coder for adaptive differential PCM (ADPCM), adaptive transform coding (ATC) and so forth, and an entropy coder. The coder provides an encoded word which is obtained by compacting the amount of input information. The coded word is then changed to an entropy-coded word by the entropy coder. The entropy-coded word is transmitted from the transmission part to the receiving part. The receiving part conversely decodes the entropy-coded word to reproduce the voice signal.

Accompanied by the developments of digital lines in recent years, a system for compacting the amount of information to obtain coded signals at a high efficiency has been desired in order to effectively utilize the lines.

Also, to store voice information in a voice storage or voice response system, it is important to decrease the capacity of the storing memory. The system for compacting the amount of information and for coding at a high efficiency will satisfy the above requirements.

(2) Description of the Related Art

As a voice signal coding apparatus, a coding transmission apparatus is conventionally known in which a coder and an entropy coder are combined to code voice signals with high efficiency. The coder carries out compacting and coding of voice signals by means of adaptive differential PCM (ADPCM), adaptive transform coding (ATC) and so forth. The entropy coder carries out removing of statistical redundancy in quantized values.

In the coding transmission apparatus for carrying out coding of voice signals at high efficiency, since the voice signals have nonuniform probability of symbols, the statistical characteristics of the output of the coder are changed so that the code lengths, i.e., bit rates, of the entropy-coded results are not constant, and the bit rate may happen to be larger than the allowable transmission bit rate so that the transmission becomes impossible.

Conventionally, to solve the above problem, the entropy encoded result is stored in a buffer memory and is transmitted from the buffer memory through the transmission line. To this end, a buffer control system has been employed in which the entropy-coded results are controlled by changing the quantization characteristics of a quantizer in the coder. This conventional system is described in "On the Information Rate Control in Entropy-coded Speech Transmission Systems", written by M. Copperi, CSELT Rapportitecnici Vol. X-No. 6-DECEMBER, 1982 PP 435-449.

In the above described conventional art, a buffer memory is used to control the entropy coded results. In practice, however, an overflow or an underflow of the buffer memory occurs depending on the characteristics of the coder and the entropy coder.

Further, in the control method by means of the buffer memory, the control is carried out in such a way that the input/output characteristics of the quantizer in the coder is changed so that the statistical characteristics of the quantized output codewords are controlled so as to make the entropies small. Namely, the entropies concentrate to certain values. Therefore, the characteristics of the quantizer itself do not always become optimum, and the characteristic of the coder is not always good.

Further, when there is a transmission error, the error is transmitted in the entropy decoder. Therefore, once a transmission error is generated, the error is superimposed on the next decoded result causing a problem such that the one transmission error influences several samples.

SUMMARY OF THE INVENTION

In view of the above problems in the conventional art, an object of the present invention is to provide a voice coding/decoding system capable of coding and transmitting input voice signal in an optimum state without passing through a buffer memory and without having a negative influence on the coder.

To attain the above object, there is provided, according to the present invention, a voice coding/decoding system having a transmitting part for transmitting a coded signal of an input voice signal at a bit rate lower than a predetermined transmission bit rate and a receiving part for receiving and decoding the coded signal transmitted from the transmission part. The transmitting part comprises a plurality of coders for coding the input voice signals. The coders have different numbers of quantizer output levels, different quantization characteristics, or different numbers of quantizer output levels and different quantization characteristics. The transmitting part also comprises a plurality of groups of entropy coders. The inputs of the entropy coders in each of the groups are connected to the output of one of the plurality of coders. The entropy coders in each of the groups have the same number of quantizer output levels as the number of quantizer output levels in one of the plurality of coders connected to the group, and different probability distributions. The transmitting part further comprises an evaluation part, operatively connected to the local decoder outputs of the plurality of coders and the outputs of the plurality of entropy coders, for evaluating the characteristics of the local decoder outputs of the coders and the entropy coders to extract the entropy coders having output bit rates lower than the transmission bit rate and to extract, from the coders connected to the extracted entropy coders, a coder having the best output characteristic, to output a selecting signal indicating the combination of the selected order and an entropy coder among the extracted entropy coders. The transmitting part still further comprises a selecting part, operatively connected to the outputs of the plurality of entropy coders and to the output of the evaluation part, for selecting, in response to the selecting signal, the codeword passed through the combination of the coder and the entropy coder for transmission.

The receiving part comprises a plurality of decoders for decoding the received codeword, having different numbers of quantizer output levels from each other, different quantization characteristics, or different numbers of quantizer output levels from each other, different quantization characteristics; and a plurality of groups of entropy decoders, the outputs of the entropy decoders in each of the groups being connected to the input of one of the plurality of decoders, the entropy decoders in each of the groups having the same number of quantizer output levels as the number of quantizer output levels in the one of the plurality of coders connected to the group and having different probability distributions; whereby, in accordance with the selecting signal indicating the combination of the selected coder and the selected entropy coder, the transmitted codeword is decoded by the combination of an entropy decoder and a decoder corresponding to the combination of the selected order and the selected entropy order.

BRIEF DESCRIPTION OF THE DRAWINGS

The above object and features of the present invention will be more apparent from the following description of the preferred embodiment with reference to the drawings, wherein.

DESCRIPTION OF THE PREFERRED EMBODIMENT

Figure 1:
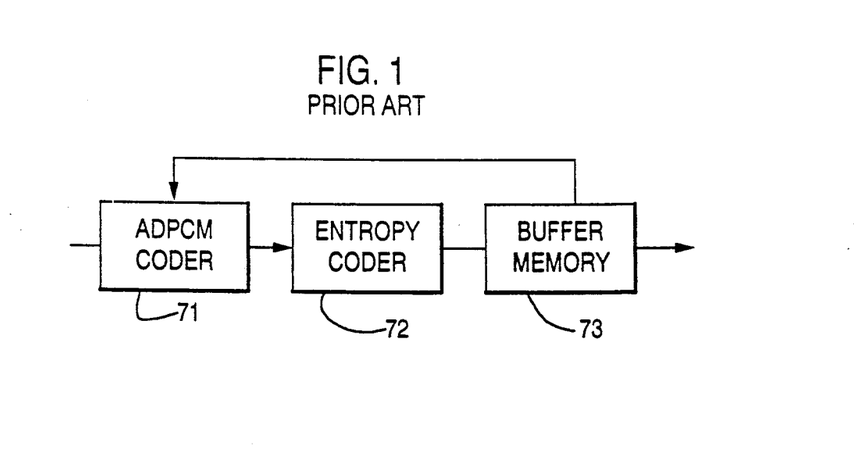
FIG. 1 is a diagram showing a conventional voice coding and transmission system.

For better understanding of the present invention, a conventional voice coding transmission system is first described with reference to FIG. 1. In FIG. 1, 71 represents an ADPCM coder, 72 represents an entropy coder, and 73 represents a buffer memory.

As described before, since the voice signals have nonuniform probability of symbols, the statistical characteristics of the output of the coder are changed so that the code lengths, i.e., bit rates, of the entropy-coded results are not constant, and the bit rate may be larger than the transmission bit rate so that the transmission becomes impossible. To solve this problem, the entropy-coded result is stored in the buffer memory 73 and is transmitted from the buffer memory 73 to the transmission line. To this end, a buffer control system has been employed in which the entropy-coded results are controlled by changing the quantization characteristics of a quantizer in the coder. This conventional system is described in "On the Information Rate Control in Entropy-coded Transmission Systems", written by M. Copperi, CSELT Rapportitecnici Vol. X-No. 6- DECEMBER, 1982 PP 435–449.

In the above described conventional art, a buffer memory 73 is used to control the entropy-coded results. In practice, however, an overflow or an underflow of the buffer memory 73 occurs depending on the characteristics of the coder and the entropy coder.

Further, in the control method using part of the buffer memory, the control is carried out in such a way that the input/output characteristics of the quantizer in the coder is changed so that the statistical characteristics of the quantized output codewords are controlled in such a way that the entropy becomes small, namely, the entropy becomes a certain small value. Therefore, the characteristics of the quantizer itself do not always become optimum, and the characteristic of the coder is not always good.

Further, when there is a transmission error, the error is transmitted in the entropy decoder. Therefore, once a transmission error is generated, the error is superimposed on the next decoded result so that there is a problem in that the one transmission error influences several samples.

The above-described problems in the conventional art are solved by the present invention.

Embodiments of the present invention will be described in the following.

Figure 2:
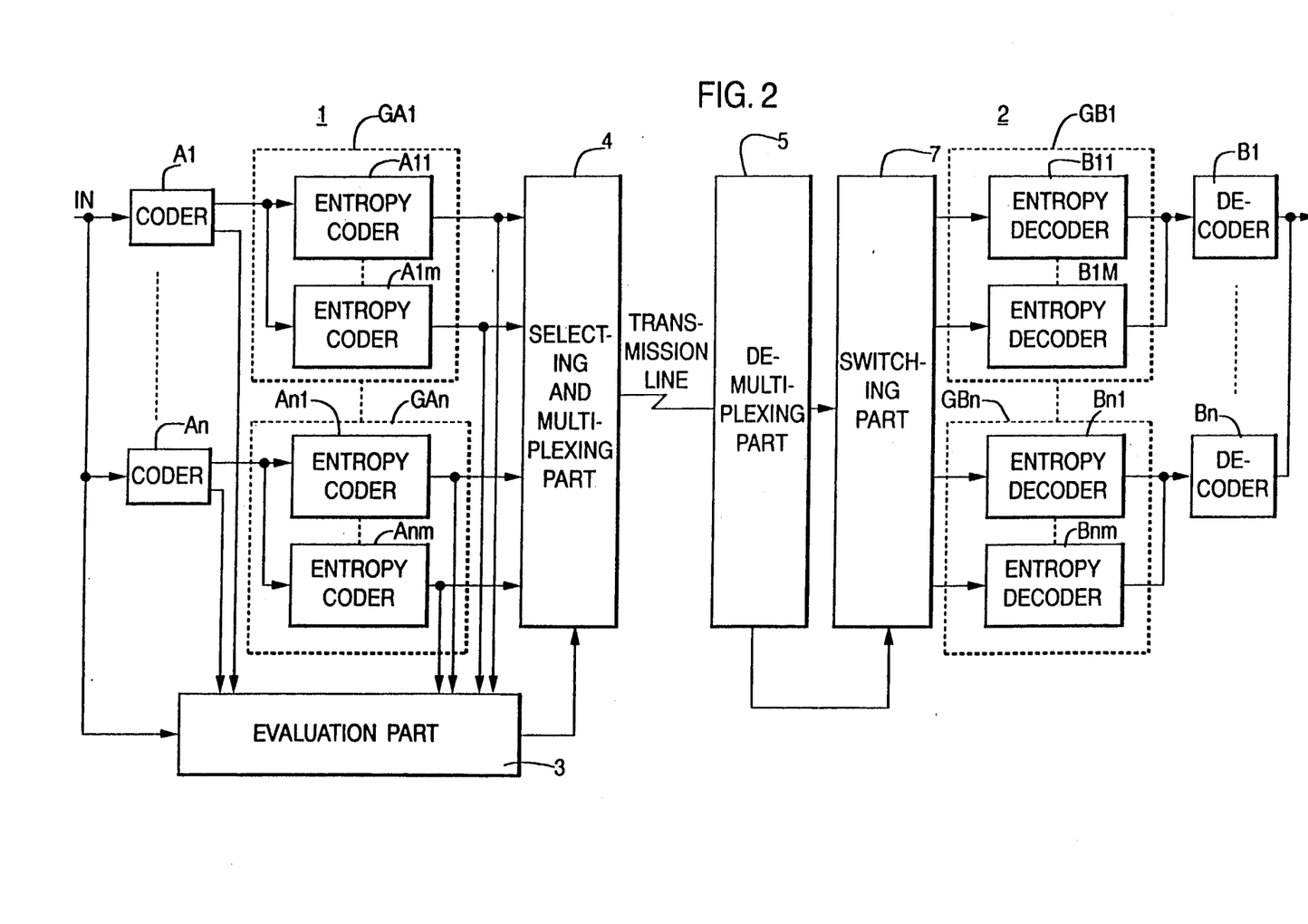
FIG. 2 is a diagram showing the principal construction of a voice coding/decoding system according to an embodiment of the present invention.

FIG. 2 is a diagram showing the principal construction of a voice coding/decoding system according to an embodiment of the present invention. In the figure, the system consists of a transmission part 1 and a receiving part 2. The transmission part 1 includes a plurality of coders A1 to An, a plurality of groups GA1 to GAn of entropy coder A11–A1m, ..., An1–Anm, evaluation part 3, and a selecting and multiplexing part 4. Each of the groups GA1 to GAn of the entropy coders corresponds to one of the coders A1 to An. The evaluation part 3 selects outputs of the entropy coders having bit rates below the transmission bit rate, evaluates the qualities of the coders corresponding to the selected entropy coders, selects an optimum combination of a coder and an entropy coder, and generates a selecting signal indicating the combination of the selected coder and the selected entropy coder. The selecting and multiplexing part 4 multiplexes the selected codeword and the selecting signal.

The plurality of coders A1 to An have different numbers of quantizer output levels (bit lengths). Alternatively, the plurality of coders A1 to An may have different quantization characteristics. As an another alternative, the plurality of coders A1 to An may have different numbers of quantizer output levels and different quantization characteristics. As an another alternative, the plurality of coders A1 to An may have different numbers of quantizer output levels and different quantization characteristics. Each of the coders corresponds to one of the groups GA1 to GAn. In each of the groups GA1 to GAn, a plurality of entropy coders have different probability distributions. The plurality of entropy coders are operated in parallel. The evaluation part 3 selects the outputs of the entropy coders having bit rates lower than the transmission bit rate from all of the outputs of the entropy coders A11 to Anm for each frame of input voice signals, evaluates the qualities of the local decoded signals from all of the coders corresponding to the entropy coders from which the selected outputs are generated, and selects a codeword having the optimum quality. The evaluation part 3 also generates a selecting signal indicating the combination of the coder and the entropy coder from which the codeword is selected. The selecting signal is applied to the selecting and multiplexing part 4. The selecting and multiplexing part 4 multiplexes the selected codeword and the selecting signal to transmit through the transmission line to the receiving part 2.

The receiving part 2 includes a demultiplexing part 5, a switching part 7, a plurality of groups GB1 to GBn of a plurality of entropy decoders B11-B1m, ..., Bn1-Bnm, and a plurality of decoders B1 to Bn each corresponding to one of the plurality of groups B11-B1m, ..., Bn1-Bnm. The demultiplexing part 5 demultiplexes the multiplexed signal received from the transmitting part 1 through the transmission line into the codeword and the selecting signal. The switching part 7 passes, in response to the demultiplexed selecting signal from the demultiplexing part 5, the demultiplexed codeword to the combination of the entropy decoder and the decoder corresponding to the combination of the coder and the entropy coder selected in the transmitting part 1. The thus selected entropy decoder carries out an entropy decoding in accordance with the probability distribution of the entropy decoder, and the selected decoder decodes, in accordance with the number of the quantizer output levels, the quantization characteristics, or the number of the quantizer output levels and the quantization characteristics, the output of the selected entropy decoder to reproduce the voice signal.

Since the voice signal has nonuniform probability of symbols, the statistical characteristics of the codewords output from a coder are different for respective frames. Therefore, the codeword lengths of the entropy coded results are different for respective frames depending on the number of the quantizer output levels, the quantization characteristics, or the number of the quantizer output levels and the quantization characteristics. In view of these facts, according to the present invention, a plurality of coders are provided and each of the coders is made to correspond to one of the groups of a plurality of entropy coders having different probability distributions. And the optimum combination of a coder and an entropy coder is selected to transmit a codeword.

In the transmitting part 1, an input voice signal is input in parallel to the coders A1 to An having different number of quantizer output levels, quantization characteristics, or number of quantizer output levels and quantization characteristics. Then coders A1 to An carry out the coding simultaneously to output codewords and local decoded signals having different numbers of quantizer output levels, different quantization characteristics, or different numbers of quantizer output levels and different quantization characteristics. The codewords have statistical nonuniformity so that there are redundancies due to the statistical nonuniformity. To remove the redundancies, the plurality of entropy decoders A11 to Anm respectively having the different probability distributions are employed to carry out entropy codings.

In the evaluation part 3, the codeword lengths of the entropy-coded results and the qualities of the local decoded signals are evaluated for each frame so that the codewords, having codeword lengths of the entropy coded results each being lower than the transmitting bit rate which is allowed on the transmission line, are selected and, among the selected codewords, a codeword having the highest quality of the characteristics of the local decoded signals is selected. Simultaneously, the selecting signal indicating the combination of the coder and the entropy coder providing the highest quality of characteristics is generated and multiplexed with the selected codeword by the selecting and multiplexing part 4 to be transmitted to the receiving part 2.

In the receiving part 2, based on the selecting signal indicating the selected combination of the coder and the entropy encoder, one of the plurality of entropy decoders B11 to Bnm and one of the plurality of decoders B1 to Bn are selected to carry out an entropy decoding and decoding, resulting in the responded voice signal.

As a result, a voice signal having a high quality characteristics can be reproduced from the receiving part 2 without employing a buffer memory for storing the entropy coded results in order to maintain the transmission bit rate to be constant as was employed in the conventional art. Also, in each coder, since the optimum quantizer can be selected, the characteristics of the output of the coder are not distorted due to deformation of the input-output characteristic of the quantizer. Still further, even when an error occurs in a frame on the transmission line, the error does not influence another frame.

Figure 3:
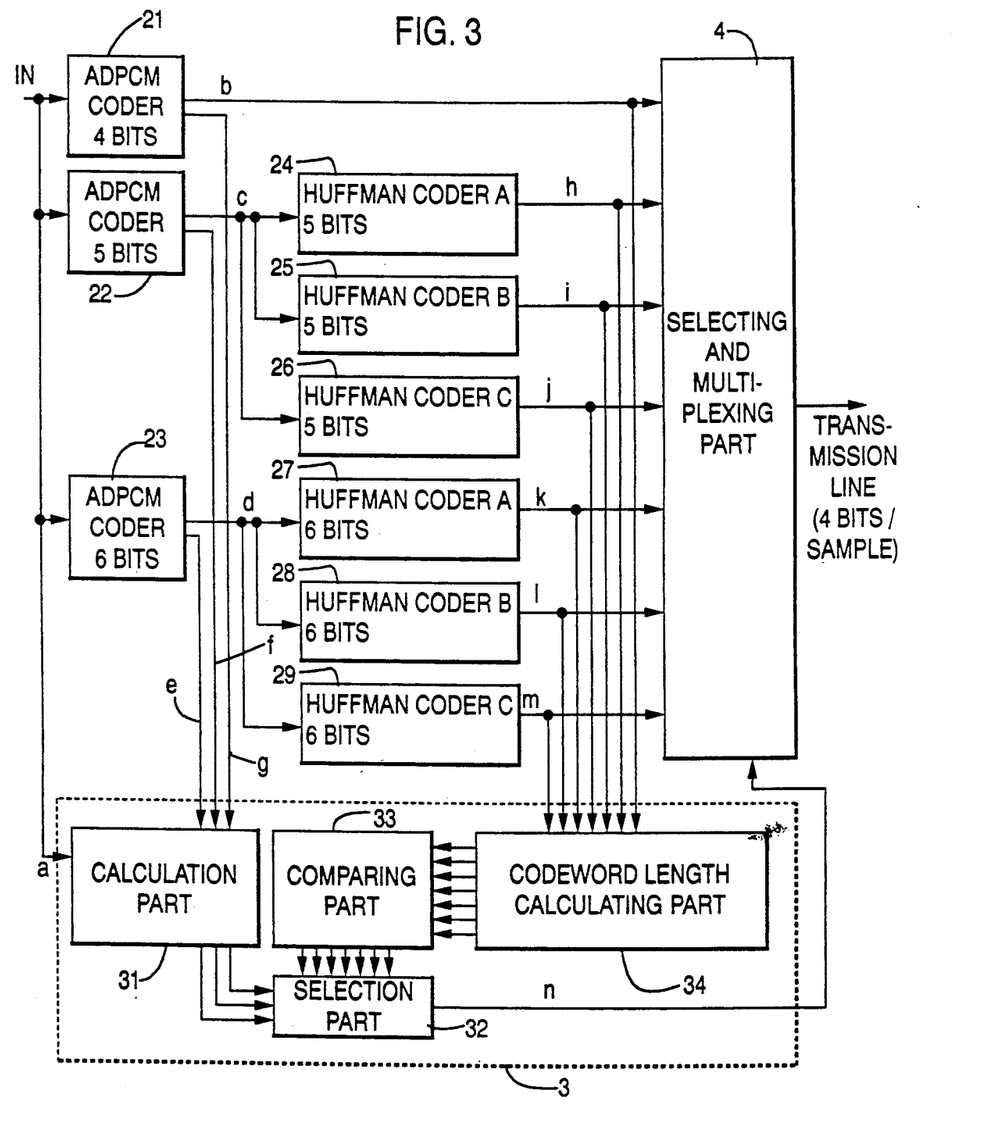
FIG. 3 is a diagram showing in detail the transmitting part of the voice coding/decoding system shown in FIG. 2.
Figure 4:
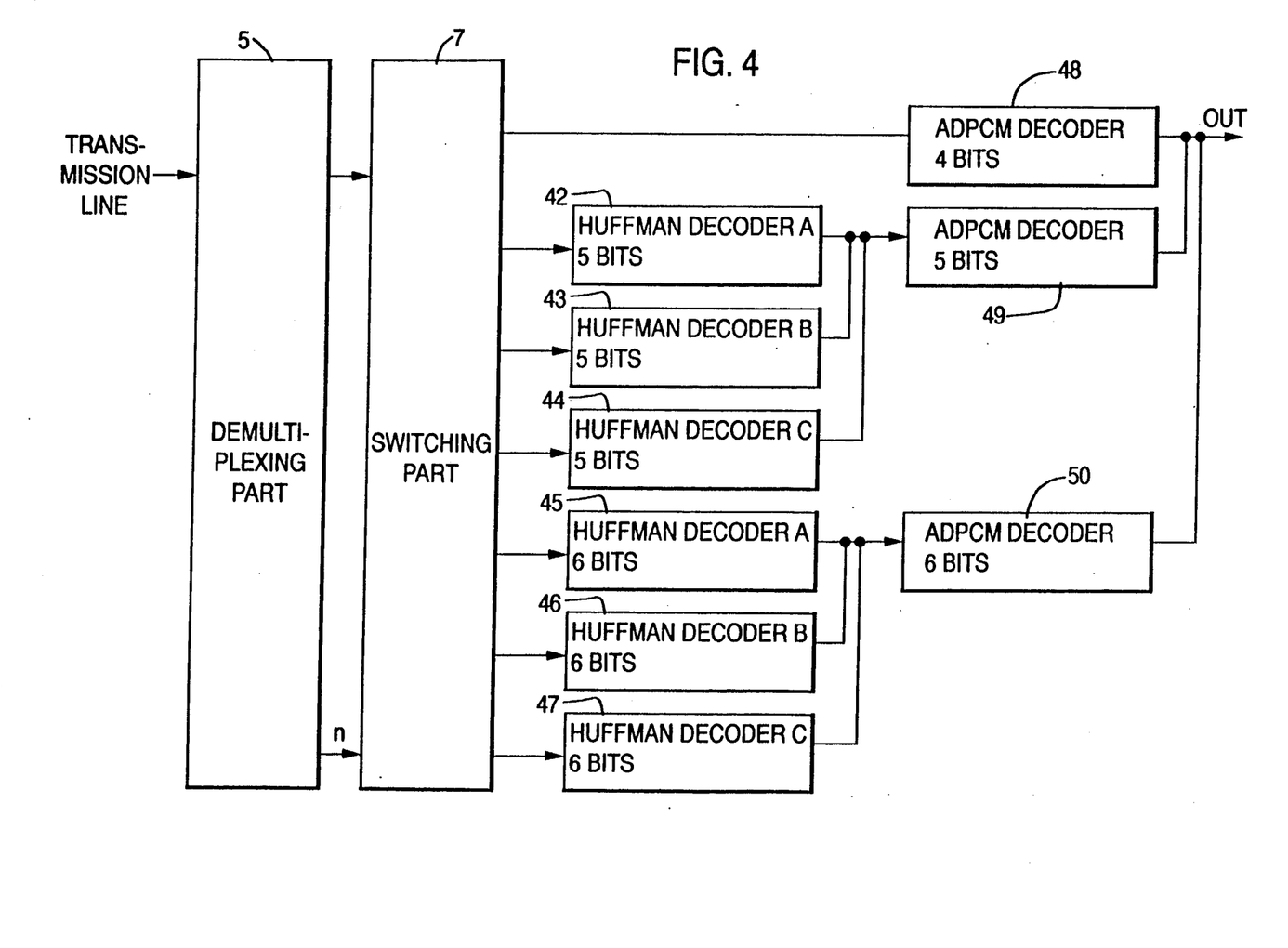
FIG. 4 is a diagram showing in detail the receiving part of the coding/decoding system shown in FIG. 2.

FIG. 3 is a diagram showing in detail the transmitting part in the system shown in FIG. 2 and FIG. 4 is a diagram showing in detail the receiving part in the system shown in FIG. 2.

In FIGS. 3 and 4, it is assumed that the transmitting bit rate is 4 bits/sample. As the coders, ADPCM coders having the numbers of quantizer output levels of 4, 5, and 6 bits, respectively, are provided. As the entropy coders, well known Huffman coders (hereinafter referred to simply as H coders) are provided.

In FIG. 3, the 5-bit ADPCM coder 22 corresponds to the 5-bit H coders 24 to 26 having different probability distributions A, B, and C. Similarly, the 6-bit ADPCM coder 23 corresponds to the 6-bit H coders 27 to 29 having different probability distributions A, B and C.

In each of the H coders, a codeword in the entropy coding should be previously prepared based on the statistical characteristics of the quantizer output (symbols). Namely, a low probability codeword is made to correspond to a long codeword and a high probability codeword is made to correspond to a short codeword. The distribution of the predictive error signals in the differential coding such as ADPCM is close to the Laplace distribution (see "The Optimum Quantization of Laplace Distribution Signal" written by Hirohisa Yamaguchi, THE JOURNAL OF THE INSTITUTE OF ELECTRONICS, INFORMATION AND COMMUNICATION ENGINEERS, vol. J67-B No. 2).

Accordingly, in this embodiment, the Laplace distribution is utilized and H coders each having a probability distribution of the entropy coding close to the Laplace distribution are assumed as the actual distribution to be used.

The output of the 4-bit coder 21 is directly connected to the input of the selecting and multiplexing part 4 without passing through an H coder. This is to ensure that the codeword can be surely obtained even when all of the bit rates of the codewords from the H coders 24 to 29 exceed the transmission bit rate of 4 bits/sample in the case when the assumed probability distribution of the codeword is greatly different from the actual distribution. Namely, it is always possible to transmit the output of the 4-bit ADPCM coder.

The ADPCM coders 21 to 23 respectively have decoders (not shown in the figure) therein. The local decoded signals e, f, and g decoded by the decoders are input to the evaluation part 3.

The evaluation part 3 has a signal to noise ratio (S/N) calculation part 31, a selection part 32, a codeword length comparing part 33, and a codeword length calculating part 34. The S/N calculation part 31 calculates, based on the input signal a and the local decoded signals e, f, and g, signal to noise ratios of the local decoded signals from the ADPCM coders 21 to 23. The codeword length calculation part 34 determines the codeword lengths of the outputs of the H coders 24 to 29. The codeword length comparing part 33 compares the codeword lengths with the transmission bit rate to selectively output the codewords having bit rates lower than the transmission bit rates.

The selection part 32 selects, based on the S/N calculated results and the compared results from the codeword length comparing part 33, a combination of an ADPCM coder and an H coder the output signal of which has a bit rate lower than the transmission bit rate and has the optimum quality. The selection part 32 outputs a selecting signal indicating the combination.

These evaluation and selection are executed in every frame.

In this embodiment, since the number of the quantization bits is changed for each frame of input voice signal, it is necessary to establish matching between the transmitting part and the receiving part. To this end, the internal coefficients of the number of quantization bits and the quantization characteristic of the ADPCM coder selected in the previous frame are copied onto all other ADPCM coders at the beginning of the processing of the next frame to be processed. The frame length is selected in such a way that the characteristic of the ADPCM coder becomes the best when the number of the quantization bits and the quantization characteristic are changed.

In this embodiment, a path without passing through any entropy coder is also provided as mentioned before.

In FIG. 4, the demultiplexing part 5 demultiplexes the multiplexed signal received from the transmitting part through the transmission line into the codeword and the selecting signal. The switching part 7 passes, in response to the demultiplexed selecting signal from the demultiplexing part 5, the demultiplexed codeword to the combination of the entropy decoder and the decoder corresponding to the combination of the coder and the entropy coder selected in the transmitting part 1. The thus selected entropy decoder carries out an entropy decoding in accordance with the probability distribution of the entropy decoder, and the selected decoder decodes, in accordance with the number of the quantizer output levels, the quantization characteristics, or the number of the quantizer output levels and the quantization characteristics, the output of the selected entropy decoder to reproduce the voice signal.

Figure 5:
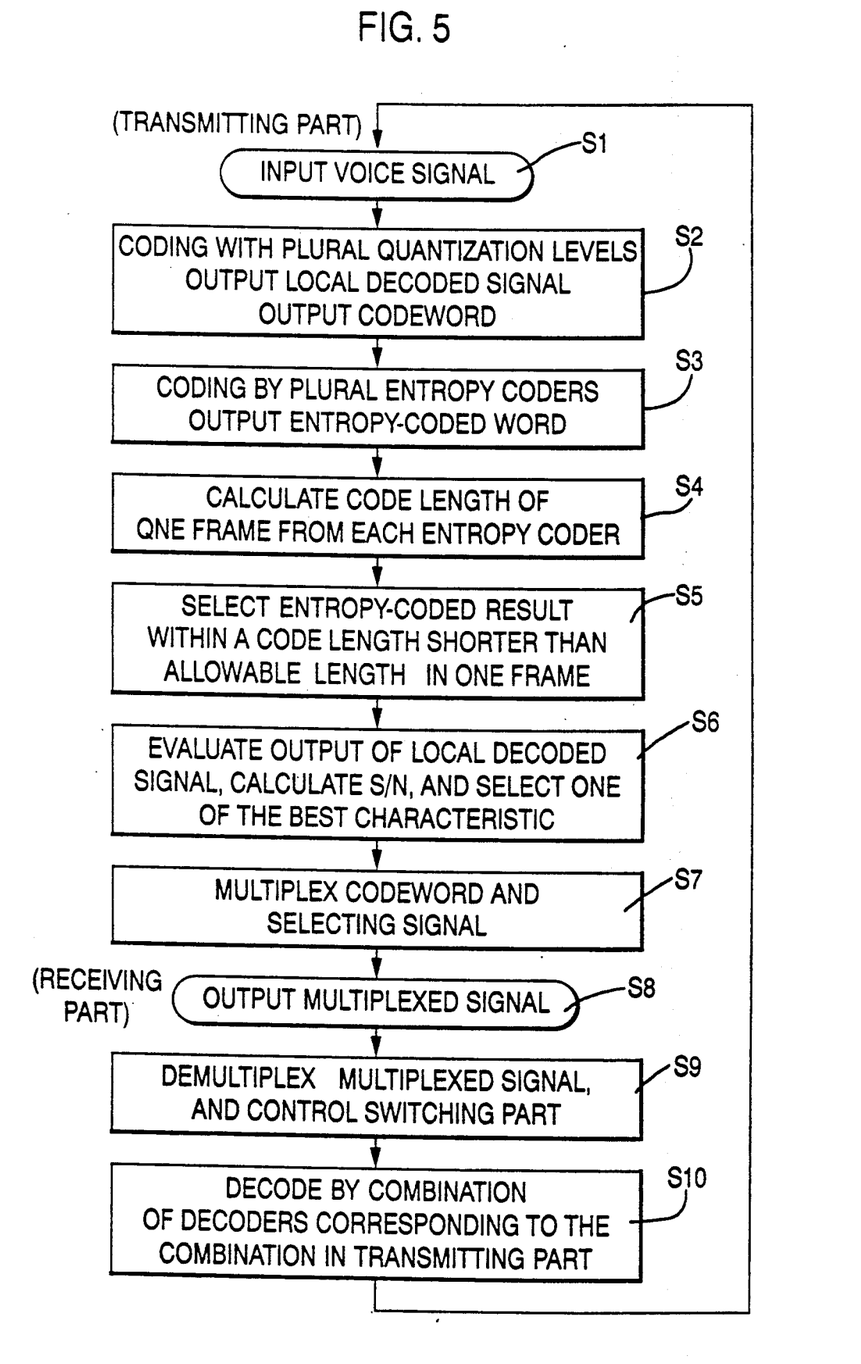
FIG. 5 is a flowchart for explaining the operation of the system shown in FIG. 2.

FIG. 5 is a flowchart for explaining the operation of the system shown in FIGS. 3 and 4. In particular, the operation flow the evaluation part 3 is shown. In the following, the operation of the system according to the above-described embodiment of the present invention is described in detail.

(1) One frame of voice signal a is input into the transmitting part 1 (step S1).

(2) The input voice signal a is coded by the plurality of ADPCM coders 21 to 23 having different numbers of quantizer output levels, to output the codewords b to d. The ADPCM coders 21 to 23 operate in parallel. In addition, the codewords b to d are decoded by decoders included in the ADPCM coders 21 to 23 to output the local decoded signals e to g (step S2).

(3) With respect to the codewords b to d, the codeword b is not entropy coded; the codeword d is entropy coded by the H coders 24 to 26 having the number of quantizer output levels of 5 bits and having different probability distributions from each other; and the codeword d is entropy coded by the H coders 27 to 29 having the number of quantizer output levels of 6 bits and having different probability distributions from each other; whereby the codewords b an h to m are generated. The codewords b and h to m are input into the selecting and multiplexing part 4 and into the evaluation part 3 (step S3).

(4) In the evaluation part 3, the codeword length calculating part 34 calculates the total codeword length of each frame of the codewords b and h to m (step S4).

(5) The codeword length comparing part 33 compares the calculated total codeword length from the codeword length calculating part 34 and the transmission bit rate (4 bits/sample in this embodiment) of the transmission line in this system to determine the lines corresponding to the codewords having bit rates lower than the transmission bit rate of, for example, 4 bit rates/sample (S5). Thus, the codeword length comparing part 33 determines the H decoders outputting the codewords having bit rates lower than the transmission bit rate.

(6) The S/N calculating part 32 calculates characteristics of the local decoded signals e to g from the ADPCM coders 21 to 23 by comparing these signals with the input signal a input into the ADPCM coders 21 to 23. The characteristics in this example are signal to noise rations (S/N). The larger the value of the characteristic, the better the characteristic is.

The selection part 32 selects one ADPCM coder among the ADPCM coders corresponding to the H coders having the output bit rates lower than the bit rate of the transmission line as determined in step S5. The selected one ADPCM coder is the one which outputs the best characteristic of S/N. The selection part 32 outputs a selection signal n to the selecting and multiplexing part 4. The selection signal n is used to select the H coder having the bit rate lower than the transmission bit rate from the group of the H coders corresponding to the selected one ADPCM coder (step S6).

(7) The selecting and multiplexing part 4 selects one codeword from among the input codewords in response to the selection signal n, and multiplexes the selected codeword and the selection signal n (step S7).

(8) The multiplexed signal formed in the step S7 is transmitted (step S8).

(9) In the receiving part 2, the transmitted codeword and the selection signal are demultiplexed by the multiplexer 5. The demultiplexed selection signal is input as a switching signal into the switching part 7 (step S9).

(10) The switching part 7 passes the demultiplexed codeword to the H decoder specified by the demultiplexed selection signal. The H decoder entropy decodes the codeword. The entropy decoded signal is further decoded by the ADPCM decoder connected to the specified H decoder. Thus, the reproduced voice signal is obtained at the output of the H decoder (step S10).

In the above-described embodiment, S/N is employed as the evaluation value of the characteristic of the code. The present invention, however, is no restricted to this, but various alternatives are possible. For example, as other evaluation means, the sum of the absolute values of the error signals, the peak value of the absolute values of the error signals, cepstrum distance, squared summation of the error signals, or a combination thereof can be used. Also, instead of the H coders as the entropy coder, arithmetic code, runlength code Ziv-lempel code and so forth may also be used for the entropy coder.

Figure 6:
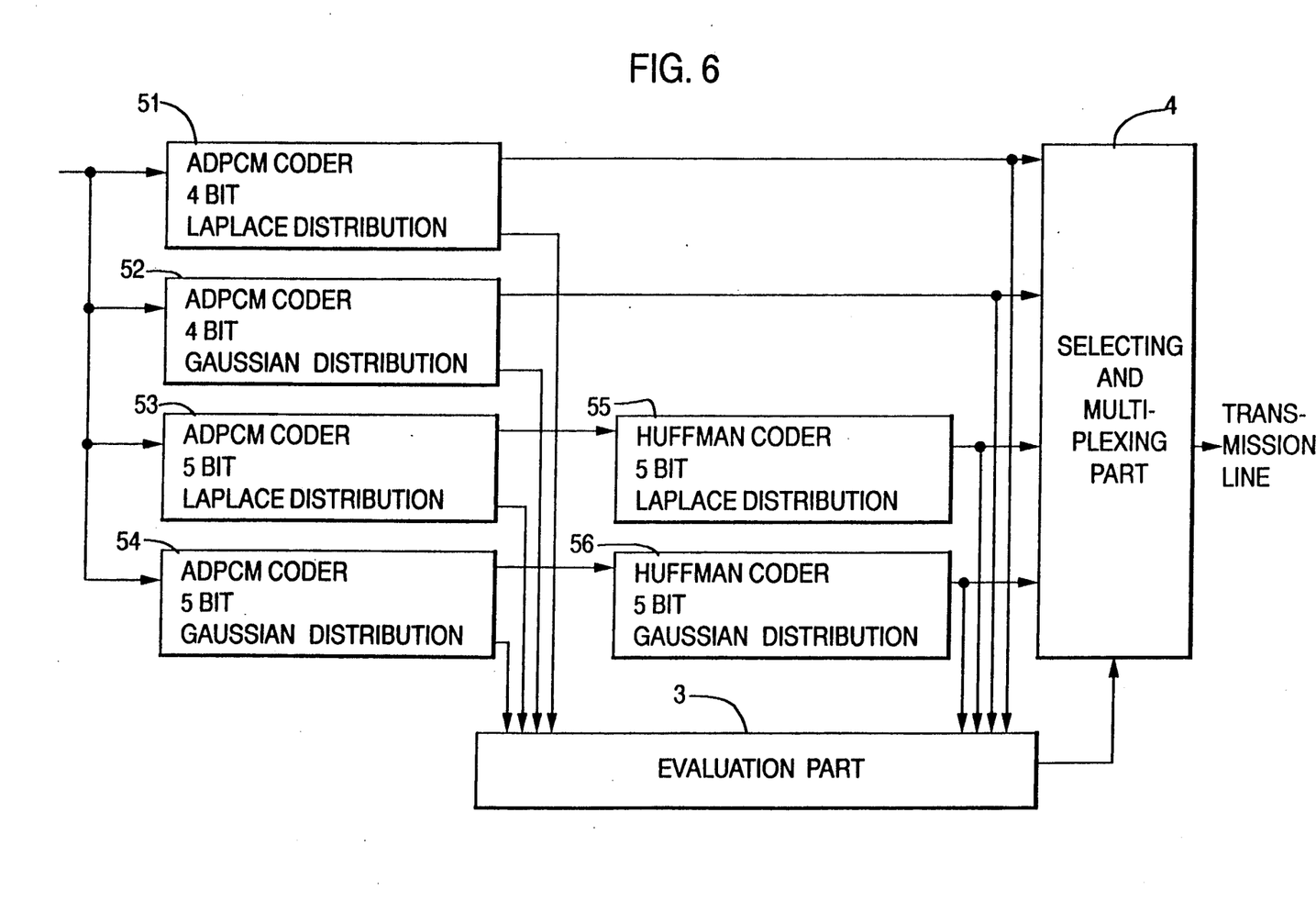
FIG. 6 is a diagram showing a transmitting part of a voice coding/decoding system according to another embodiment of the present invention.
Figure 7:
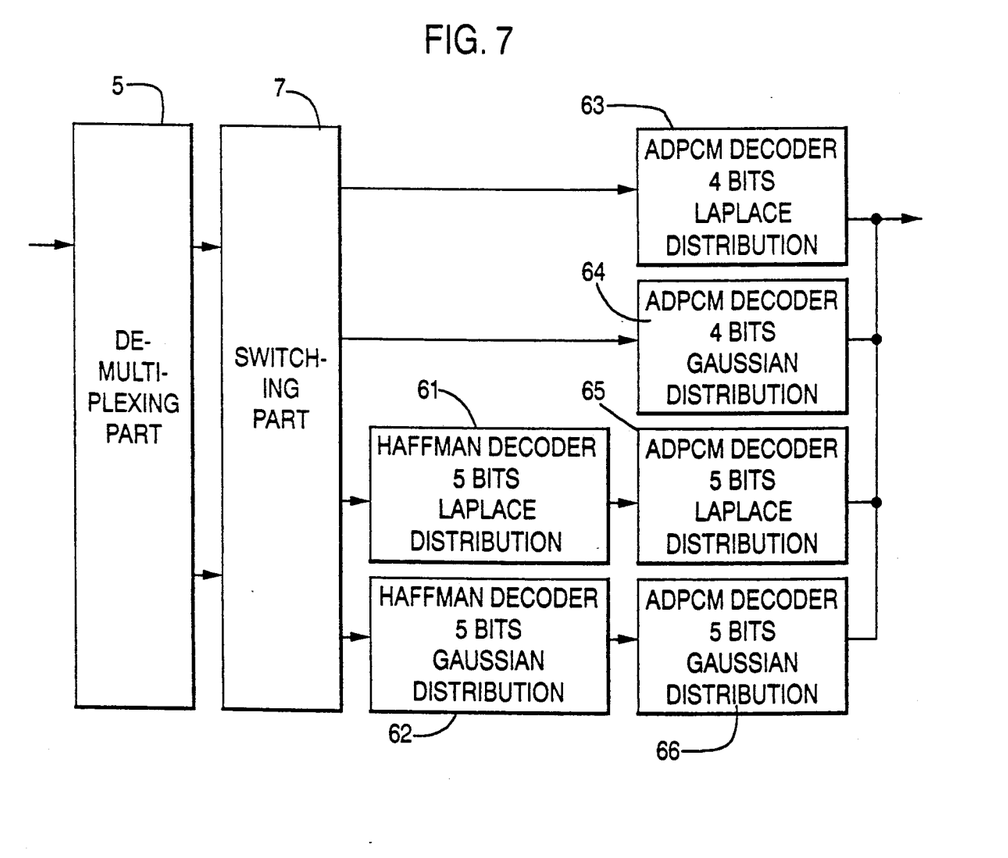
FIG. 7 is a diagram showing a receiving part of a voice coding/decoding system according to another embodiment of the present invention.

FIGS. 6 and 7 show another embodiment of the present invention. In the figures, FIG. 6 shows a transmitting part and FIG. 7 shows a receiving part. The same reference numerals throughout the FIGS. 2 to 7 represent the same part.

In this embodiment, the transmission bit rate is also assumed to be about 4 bits/sample and ADPCM coders are also used as the coders.

The coders consist of 4-bit ADPCM coders 51 and 52 and 5-bit ADPCM coders 53 and 54. The ADPCM coders 51 and 53 have quantization characteristics of Laplace distributions. The ADPCM coders 52 and 54 have quantization characteristics of Gaussian distributions. The ADPCM coders 51 to 54 are designed in accordance with the Lloyd-Max method ("HIGH-EFFICIENCY CODING OF VOICE" written by Kazuo Nakada, published in 1986 by Morikita Shuppan, pp 22-23) by which the squared summation of the error signals is minimized.

In FIG. 6, 51 is a 4-bit ADPCM coder having a Laplace distribution, 52 is a 4-bit ADPCM coder having a Gaussian distribution, 53 is a 5-bit ADPCM coder having a Laplace distribution, and 54 is a 5-bit ADPCM coder having a Gaussian distribution.

As the entropy coders, Huffman coders (H coders) are also employed. In each of the H coders, a probability codeword in the entropy coding should be previously prepared based on the probability distribution of the quantized results of the quantizer characteristics in the ADPCM coders for which a Laplace distribution and a Gaussian distribution are assumed. 55 is 5-bit H coder corresponding to the Laplace distribution and connected between the 5-bit ADPCM coder 53 and the selecting and multiplexing part 4, and 56 is a 5-bit H coder corresponding to the Gaussian distribution and connected between the 5-bit ADPCM coder 54 and the selecting and multiplexing part 4.

The ADPCM coders 51 and 54 have local decoders for providing local decoded signals which are input into the evaluation part 3. The codewords from the ADPCM coders 51 and 52, and the codewords from the H coders 55 and 56 are input to the selecting and multiplexing part 4 and the evaluation part 3.

The 4-bit ADPCM coders 51 and 52 are directly connected to the selecting and multiplexing part 4 without passing through an H coder.

The evaluation part 3 generates a selection signal based on the local decoded signals from the coders 51 to 54 and the codewords from the coders 51 and 52 and from the H coders 55 and 56, in the same way as in the previously described embodiment. The selection signal in this embodiment is 2 bits for selecting one of the four signals applied to the selecting and multiplexing part 4.

As is the same as in the first embodiment shown in FIGS. 3 and 4, S/N is employed as the evaluation value of the characteristic of the code, however, various alternations are possible. For example, as other evaluation means, the sum of the absolute values of the error signals, the peak value of the absolute values of the error signals, cepstrum distance, squared summation of the error signals, or a combination thereof can be used. Also, instead of the H coders as the entropy coder, arithmetic code, runlength code Zivlempel code and so forth may also be used for the entropy coder.

In this embodiment also, since the number of the quantization bits is changed for each frame of input voice signal, it is necessary to establish matching between the transmitting part and the receiving part. To this end, the internal coefficients of the number of quantization bits and the quantization characteristic of the ADPCM coder selected in the previous frame are copied into all other ADPCM coders at the beginning of the processing of the next frame to be processed. The frame length is selected in such a way that the characteristic of the ADPCM coder becomes the best when the number of the quantization bits and the quantization characteristic are changed.

In this embodiment, two paths without passing through an entropy coder are provided as mentioned before. This is to ensure that the codeword can be surely obtained even when all of the bit rates of the codewords from the H coders 55 and 56 exceed the transmission bit rate of 4 bits/sample in the case when the assumed probability distribution of the codeword is greatly different from the actual distribution. It is always possible to transmit the output of the 4-bit ADPCM coder. In other words, when the assumed probability distribution of the codeword is greatly different from the actual probability distribution, the average codeword length of the entropy-coded words greatly exceeds the codeword length of a codeword before the entropy codings. In such a case as above, the entropy coding is not employed. This corresponds to the case when entropy coders of uniform characteristics are combined.

In FIG. 7, the demultiplexing part 5 demultiplexes the multiplexed signal received from the transmitting part through the transmission line into the code word and the selecting signal. The switching part 7 passes, in response to the demultiplexed selecting signal from the depmultiplexing part 5, the demultiplexed codeword to the combination of the dentropy decoder and the decoder corresponding to the combination of the coder and the entropy coder selected in the transmission part.

The important difference between FIG. 4 and FIG. 7 is that, in FIG. 7, the H decoders are those of Laplace distribution and Gaussian distribution, and the ADPCM coders are those of Laplace distribution and the Gaussian distribution.

In FIG. 7, 61 is a 5-bit H decoder of Laplace distribution, 62 is a 5-bit H decoder of Gaussian distribution, 63 is a 4-bit ADPCM decoder of Laplace distribution, 64 is a 4-bit ADPCM decoder of Gaussian distribution, 65 is a 5-bit ADPCM decoder of Laplace distribution, and 66 is a 5-bit ADPCM decoder of Gaussian distribution.

The selected H decoder carries out an entropy decoding in accordance with its probability distribution. The selected ADPCM decodes its input signal in accordance with its quantization characteristic and its number of quantizer output levels to reproduce the input voice signal.

In the receiving part also, paths which do not pass through any entropy decoder are provided, corresponding to the paths which do not pass through any entropy coder in the transmitting part. This corresponds to the case when the ADPCM decoders 63 and 64 are used.

As a still another embodiment of the present invention, adaptive transform coding (ATC) may be employed in the coders.

In the ATC, the input voice signal is passed through a window and then an orthogonal transform such as a discrete cosine transform (DCT), discrete Fourier transform and so forth is carried out. The transformed components are divided into subblocks, and the amount of information to be assigned to the respective subblocks is determined to quantize the input voice signal.

In this quantization process, a plurality of coders having a different number of quantizer output levels and different quantization characteristics are operated in parallel. The quantized results are entropy coded by a plurality of entropy coders having a different number of quantization output levels and a plurality of probability distributions. The quantizers correspond to the entropy coders, respectively. Then, a combination of entropy coders from which codewords having an amount of information below the amount of information allowable for each subblock are output and a coder from which a codeword having the shortest spectrum distance from the quantized signal is selected. The selected codeword and the selection signal indicating which of the combinations is selected are multiplexed to be transmitted.

The characteristics of the quantizers, the probability characteristics of the entropy coders and so forth may be designed in the same way as in the ADPCM coders.

According to the present invention generally, there are four patterns of combinations of the quantizers in the coders and the entropy coders described as follows.

| pattern 1: | quantizer: |
| | same level |
| | different characteristics |
| | entropy coder: |
| | same level |
| | different characteristics |
| pattern 2: | quantizer: |
| | same characteristics |
| | different levels |
| | entropy coder: |
| | same characteristic |
| | different levels |
| pattern 3: | quantizer: |
| | same characteristic |
| | different levels |
| | entropy coder: |
| | different characteristics |
| | different levels |
| pattern 4: | quantizer |
| | different characteristics |
| | different levels |
| | entropy coder: |
| | different characteristics |
| | different levels |

When the number of bits of the selection signal is 2 bits, and when the allowable transmission bit rate is 4 bits/sample, the above four patterns can be practically described as follows.

pattern 1
combination 1:
quantizer: 5-bit nonlinear quantization optimized to a Gaussian distribution
entropy coder: optimized to the output of the quantizer when a signal of the Gaussian distribution is input to the 5-bit quantizer optimized to the Gaussian distribution
combination 2:
quantizer: 5-bit nonlinear quantization optimized to a Laplace distribution
entropy coder: optimized to the output of the quantizer when a signal of the Laplace distribution is input to the 5-bit quantizer optimized to the Laplace distribution
combination 3:
quantizer: 5-bit nonlinear quantization optimized to a Gaussian distribution
entropy coder: optimized to the output of the quantizer when a signal of the Laplace distribution is input to the 5-bit quantizer optimized to the Gaussian distribution
combination 4:
quantizer: 5-bit nonlinear quantization optimized to a Laplace distribution
entropy coder: optimized to the output of the quantizer when a signal of the Gaussian distribution is input to the 5-bit quantizer optimized to the Laplace distribution pattern 2
combination 1:
quantizer: 7-bit linear quantization
entropy coder: optimized to the output of the quantizer when a signal of a Laplace distribution is input to the 7-bit linear quantizer
combination 2:
quantizer: 6-bit linear quantization
entropy coder: optimized to the output of the quantizer when a signal of a Laplace distribution is input to the 6-bit linear quantizer
combination 3:
quantizer: 5-bit linear quantization
entropy coder: optimized to the output of the quantizer when a signal of a Laplace distribution is input to the 5-bit linear quantizer
combination 4:
quantizer: 4-bit linear quantization
entropy coder: optimized to the output of the quantizer when a signal of a Laplace distribution is input to the 5-bit linear quantizer pattern 3
combination 1:
quantizer: 5-bit linear quantization
entropy coder: optimized to the output of the quantizer when a signal of a Gaussian distribution is input to the 5-bit linear quantizer
combination 2:
quantizer: 6-bit linear quantization
entropy coder: optimized to the output of the quantizer when a signal of a Laplace distribution is input to the 6-bit linear quantizer
combination 3:
quantizer: 6-bit linear quantization
entropy coder: optimized to the output of the quantizer when a signal of a Gamma distribution is input to the 6-bit linear quantizer
combination 4:
quantizer: 4-bit linear quantization
entropy coder: without an entropy coder pattern 4
combination 1:
quantizer: 5-bit nonlinear quantization optimized to a Gaussian distribution
entropy coder: optimized to the output of the quantizer when a signal of a Gaussian distribution is input to the 5-bit quantizer optimized to a Gaussian distribution
combination 2:
quantizer: 4-bit nonlinear quantization optimized to a Gaussian distribution
entropy coder: without any entropy coder
combination 3:
quantizer: 5-bit nonlinear quantization optimized to a Laplace distribution
entropy coder: optimized to the output of the quantizer when a signal of a Gaussian distribution is input to the 5-bit quantizer optimized to a Laplace distribution
combination 4:
quantizer: 4-bit nonlinear quantization optimized to a Laplace distribution

| entropy coder: | without an entropy coder |

Note that, in the above example, the state of "without any entropy coder" is equivalent to the combination of an entropy coder which is optimized to the output of the quantizer when a signal of uniform distribution is input into the linear quantizer.

The pattern 1 corresponds to the first embodiment shown in FIGS. 3 and 4, and the pattern 2 corresponds to the second embodiment shown in FIGS. 7 and 8.

From the foregoing description it will be apparent that, according to the present invention, by providing, in a transmitting part, a plurality of coders having different numbers of quantizer output levels, different quantization characteristics, or different numbers of quantizer output levels and different quantization characteristics, and a plurality of entropy coders having different probability distributions, and by selecting a suitable combination of a coder and an entropy coder in a transmitting part and corresponding combination of a decoder and an entropy decoder in a receiving part, coding an decoding can be accomplished with the optimal decoded characteristic and with adaptively removing the redundancy of the codewords due to the statistical characteristics without utilizing a buffer memory. Further, even when a transmission error occurs, the error influences only the signals in the frame where the error has occurred so that resistance to transmission errors is improved. Accordingly, by the present invention, a highly reliable voice coding/decoding system can be realized.

We claim:

1. A voice coding/decoding system having a transmitting part for transmitting a coded signal of an input voice signal at a bit rate lower than a predetermined transmission bit rate and a receiving part receiving and decoding the coded signal transmission form said transmission part, said transmitting part comprising:

a plurality of coders, each having an output, for receiving an input voice signal, and for coding the input voice signal, said coders having predetermined numbers of quantizer output levels and having a predetermined quantization characteristic;

a plurality of groups of entropy coders, each of said entropy coders in each of said groups having an input operatively connected to the output of one of said plurality of coders and outputs, said entropy coders having predetermined numbers of quantizer output levels and predetermined probability distributions;

evaluation means, operatively connected to the outputs of said plurality of coders and the outputs of said plurality of entropy coders, for evaluating characteristics of the outputs of said coders and said entropy coders in order to select, from said entropy coders, selected entropy coders having output bit rates lower than the transmission bit rate and to select, from the coders connected to the selected entropy coders, a selected coder having the best output characteristic, by outputting a selecting signal indicating a combination of the selected coder and an entropy coder in the selected entropy coders; and selecting means, operative connected to the outputs of said plurality of entropy coders and to the output of said evaluation means, for selecting, in response to the selecting signal a codeword passed through said combination of the selected coder and entropy coder to be transmitted.

2. A voice coding/decoding system as claimed in claim 1, wherein said predetermined numbers of quantizer output levels of said plurality of coders are the same as each other, said predetermined quantization characteristics of said plurality of coders are different from each other, the numbers of said predetermined quantization output levels of said entropy coders in each of said groups are the same as each other, and the quantization characteristics in each of said groups of entropy coders are different from each other.

3. A voice coding/decoding system as claimed in claim 1, wherein said predetermined numbers of quantizer output levels of said plurality of coders are different from each other, said predetermined quantization characteristics of said plurality of coders are the same as each other, the numbers of said predetermined quantization output levels of said entropy coders in each of said groups are different from each other, and the quantization characteristics in each of said groups of entropy coders are the same as each other.

4. A voice coding/decoding system as claimed in claim 1, wherein said predetermined numbers of quantizer output levels of said plurality of coders are different from each other, said predetermined quantization characteristics of said plurality of coders are the same as each other, the numbers of said predetermined quantization output levels of said entropy coders in each of said groups are different from each other, and the quantization characteristics in each of said groups of entropy coders are different from each other.

5. A voice coding/decoding system as claimed in claim 1, wherein said predetermined numbers of quantizer output levels of said plurality of coders are different from each other, said predetermined quantization characteristics of said plurality of coders are different from each other, the numbers of said predetermined quantization output levels of said entropy coders in each of said groups are different from each other, and the quantization characteristics in each of said groups of entropy coders are different from each other.

6. A voice/decoding system as claimed in claim 1, wherein said selecting means comprises multiplexing means for multiplexing the codeword passed through said combination with the selecting signal.

7. A voice coding/decoding system as claimed in claim 1, wherein at least one of said coders is directly connected to said selecting means without connecting through said entropy coders.

8. A voice coding/decoding system as claimed in claim 1, wherein said plurality of coders comprise adaptive differential pulse code modulation coders.

9. A voice coding/decoding system as claimed in claim 1, wherein each of said plurality of coders includes a quantizer.

10. A voice coding/decoding system as claimed in claim 1, wherein each of said plurality of coders comprises a local decoder for generating a local decoded signal by locally decoding the codeword output from the coder, said local decoded signal being supplied to said evaluation means for extracting a coder having said best characteristic.

11. A voice coding/decoding system as claimed in claim 10, wherein the characteristics of said coders are signal to noise ratios in said local decoded signal.

12. A voice coding/decoding system as claimed in claim 10, wherein the characteristics of said coders are the summation of the absolute values of the error signals in each local decoded signal.

13. A voice coding/decoding system as claimed in claim 10, wherein the characteristics of said coders are the peak value of the absolute value of the error signals in said local decoded signal.

14. A voice coding/decoding system as claimed in claim 10, wherein the characteristics of said coders are the cepstrum distances in said local decoded signal.

15. A voice coding/decoding system as claimed in claim 1, wherein said entropy coders are Huffman coders.

16. A voice coding/decoding system as claimed in claim 1, wherein said entropy coders are arithmetic coders.

17. A voice coding/decoding system as claimed in claim 1, wherein said entropy coders are runlength coders.

18. A voice coding/decoding system as claimed in claim 1, wherein said entropy coders are Ziv-lempel coders.

19. A voice coding/decoding system as claimed in claim 1, wherein said receiving part comprises:
   demultiplexing means, operatively connected to the output of said transmitting part through a transmission line, for demultiplexing a received signal from said transmitting part into the codeword and the selecting signal;
   switching means, operatively connected to said demultiplexing means, having a single input end for receiving the codeword from said demultiplexing means and a plurality of output ends, for passing said codeword to one of said plurality of output ends in response to the selecting signal from said demultiplexing means;
   a plurality of groups of entropy coders, each of said entropy coders in each of said groups having an input operatively connected to said plurality of output ends of said switching means and outputs, said entropy coders in each of said groups having predetermined numbers of quantizer output levels and predetermined probability distributions corresponding to a corresponding group of entropy coders in said transmitting group; and
   a plurality of decoders each having an input, the outputs of said entropy decoders in each of said groups being operatively connected to the input of one of said plurality of decoders, for decoding an entropy decoded codeword from said entropy decoders, said decoders having predetermined numbers of quantizer output levels and having the predetermined quantization characteristics;
   whereby, in accordance with the selecting signal indicating the best combination of a coder and an entropy coder, by the corresponding combination of one of said entropy decoders and one of said coders, the transmitted codeword is decoded.

20. A voice coding/decoding system as claimed in claim 19, wherein said predetermined numbers of quantizer output levels of said plurality of coders are the same as each other, said predetermined quantization characteristics of said plurality of coders are different from each other, the numbers of said predetermined quantization output levels of said entropy coders in each of said groups are the same as each other, and the quantization characteristics in each of said groups of entropy coders are different from each other.

21. A voice coding/decoding system as claimed in claim 20, wherein said predetermined numbers of quantizer output levels of said plurality of decoders are the same as each other, said predetermined quantization characteristics of said plurality of decoders are different from each other, the numbers of said predetermined quantization output levels of said entropy decoders in each of said groups are the same as each other, and the quantization characteristics in each of said groups of entropy decoders are different from each other.

22. A voice coding/decoding system as claimed in claim 19, wherein said predetermined numbers of quantizer output levels of said plurality of coders are different from each other, said predetermined quantization characteristics of said plurality of coders are the same as each other, the numbers of said predetermined quantization output levels of said entropy coders in each of said groups are different from each other, and the quantization characteristics in each of said groups of entropy coders are the same as each other.

23. A voice coding/decoding system as claimed in claim 22, wherein said predetermined numbers of quantizer output levels of said plurality of decoders are different from each other, said predetermined quantization characteristics of said plurality of decoders are the same as each other, the numbers of said predetermined quantization output levels of said entropy decoders in each of said groups are different from each other, and the quantization characteristics in each of said groups of entropy decoders are the same as each other.

24. A voice coding/decoding system as claimed in claim 19, wherein said predetermined numbers of quantizer output levels of said plurality of coders are different from each other, said predetermined quantization characteristics of said plurality of coders are the same as each other, the numbers of said predetermined quantization output levels of said entropy coders in each of said groups are different from each other, and the quantization characteristics in each of said groups of entropy coders are different from each other.

25. A voice coding/decoding system as claimed in claim 24, wherein said predetermined numbers of quantizer output levels of said plurality of decoders are different from each other, said predetermined quantization characteristics of said plurality of decoders are the same as each other, the numbers of said predetermined quantization output levels of said entropy decoders in each of said groups are different from each other, and the quantization characteristics in each of said groups of entropy coders are different from each other.

26. A voice coding/decoding system as claimed in claim 19, wherein said predetermined numbers of quantizer output levels of said plurality of coders are different from each other, said predetermined quantization characteristics of said plurality of coders are different from each other, the numbers of said predetermined quantization output levels of said entropy coders in each of said groups are different from each other, and the quantization characteristics in each of said groups of entropy coders are different from each other.

27. A voice coding/decoding system as claimed in claim 26, wherein said predetermined numbers of quantizer output levels of said plurality of decoders are different from each other, said predetermined quantization characteristics of said plurality of decoders are different from each other, the numbers of said predetermined quantization output levels of said entropy decoders in each of said groups are different from each other, and the quantization characteristics in each of said groups of entropy coders are different from each other.

28. A voice coding/decoding system as claimed in claim 19, wherein at least one of said decoders is directly connected to said switching means without connecting through said entropy decoders.

29. A voice coding/decoding system as claimed in claim 19, wherein said plurality of decoders are ADPCM decoders.

30. A voice coding/decoding system as claimed in claim 19, wherein each of said plurality of decoders includes a quantizer.

31. A voice coding/decoding system as claimed in claim 19, wherein said entropy coders are Huffman decoders.

32. A voice coding/decoding system as claimed in claim 19, wherein said entropy decoders are arithmetic decoders.

33. A voice coding/decoding system as claimed in claim 19, wherein said entropy decoders are runlength decoders.

34. A voice coding/decoding system as claimed in claim 19, wherein said entropy decoders are Ziv-lempel decoders.

35. A voice coding/decoding system having a transmitting part for transmitting a coded signal of an input voice signal at a bit rate lower than a predetermined transmission bit rate and a receiving part receiving and decoding the coded signal transmitted from said transmission part, said transmitting part comprising:
 a plurality of coders, each having an output, for receiving an input voice signal, and for coding the input voice signal, said coders having predetermined numbers of quantizer output levels and having a predetermined quantization characteristic;
 a plurality of groups of entropy coders, each of said entropy coders having an input operatively connected to a corresponding output of said plurality of coders and outputs, said entropy coders having predetermined numbers of quantizer output levels and predetermined probability distributions;
 evaluation means, operatively connected to the outputs of said plurality of coders and the outputs of said plurality of entropy coders, for evaluating characteristics of the outputs of said coders and said entropy coders in order to select, from said entropy coders, selected entropy coders having output bit rates lower than the transmission bit rate and to select, from the coders connected to the selected entropy coders, a selected coder having the best output characteristic, by outputting a selecting signal indicating a combination of the selected coder and an entropy coder in the selected entropy coders; and
 selecting means, operative connected to the outputs of said plurality of entropy coders and to the output of said evaluation means, for selecting, in response to the selecting signal, a codeword passed through said combination of the selected coder and entropy coder to be transmitted.

36. A voice coding/decoding system as claimed in claim 35, wherein said predetermined numbers of quantizer output levels of said plurality of coders are the same as each other, said predetermined quantization characteristics of said plurality of coders are different from each other, the numbers of said predetermined quantization output levels of said entropy coders are the same as each other, and the quantization characteristics of said entropy coders are different from each other.

37. A voice coding/decoding system as claimed in claim 35, wherein said selecting means comprises multiplexing means for multiplexing the codeword passed through said combination with the selecting signal.

38. A voice coding/decoding system as claimed in claim 35, further comprising at least one coder directly connected to said selecting means without connecting through any entropy coder.

39. A voice coding/decoding system as claimed in claim 35, wherein said plurality of coders comprise adaptive differential pulse code modulation coders.

40. A voice coding/decoding system as claimed in claim 35, wherein each of said plurality of coders includes a quantizer.

41. A voice coding/decoding system as claimed in claim 35, wherein each of said plurality of coders comprises a local decoder for generating a local decoded signal by locally decoding the codeword output from the coder, said local decoded signal being supplied to said evaluation means for extracting a coder having said best characteristic.

42. A voice coding/decoding system as claimed in claim 41, wherein the characteristics of said coders are the summation of the absolute values of the error signals in said local decoded signal.

43. A voice coding/decoding system as claimed in claim 41, wherein the characteristics of said coders are the peak value of the absolute values of the error signals in said local decoded signal.

44. A voice coding/decoding system as claimed in claim 41, wherein the characteristics of said coders are the cepstrum distances in said local decoded signal.

45. A voice coding/decoding system as claimed in claim 35, wherein the characteristics of said coders are signal to noise ratios in said local decoded signal.

46. A voice coding/decoding system as claimed in claim 35, wherein said entropy coders are Huffman coders.

47. A voice coding/decoding system as claimed in claim 35, wherein said entropy coders are arithmetic coders.

48. A voice coding/decoding system as claimed in claim 35, wherein said entropy coders are runlength coders.

49. A voice coding/decoding system as claimed in claim 35, wherein said entropy coders are Ziv-lempel coders.

50. A voice coding/decoding system as claimed in claim 35, wherein said receiving part comprises:
 demultiplexing means, operatively connected to the output of said transmitting part through a transmission line, for demultiplexing a received signal from said transmitting part into the codeword and the selecting signal;
 switching means, operatively connected to said demultiplexing means, having a single input end for receiving the code word and a plurality of output ends, for passing said codeword from said demultiplexing means to one of said plurality of output ends in response to the selecting signal from said demultiplexing means;
 a plurality of entropy decoders, each of said entropy decoders having inputs operatively connected to said plurality of output ends of said switching means and outputs, said entropy decoders having predetermined numbers of quantizer output levels and predetermined probability distributions corresponding to a corresponding entropy coder in said transmitting part; and a plurality of decoders each having an input, the outputs of said entropy decoders being operatively connected to the inputs of said plurality of decoders, respectively, for decoding the entropy decoded codeword from said entropy decoders, said decoders having predetermined numbers of quantizer output levels and having the predetermined quantization characteristics;

whereby, in accordance with the selecting signal indicating the best combination of a coder and an entropy coder, by the corresponding combination of one of said entropy decoders and one of said coders, the transmitted codeword is decoded.

51. A voice coding/decoding system as claimed in claim 50, wherein said predetermined numbers of quantizer output levels of said plurality of coders are the same as each other, said predetermined quantization characteristics of said plurality of coders are different from each other, the numbers of said predetermined quantization output levels of said entropy coders are the same as each other, and the quantization characteristics of said entropy coders are different from each other.

52. A voice coding/decoding system as claimed in claim 51, wherein said predetermined numbers of quantizer output levels of said plurality of decoders are the same as each other, said predetermined quantization characteristics of said plurality of decoders are different from each other, the numbers of said predetermined quantization output levels of said entropy decoders are the same as each other, and the quantization characteristics of said entropy decoders are different from each other.

53. A voice coding/decoding system as claimed in claim 50, further comprising at least one decoder directly connected to said switching means without connecting through any entropy decoder.

54. A voice coding/decoding system as claimed in claim 50, wherein said plurality of decoders are ADPCM decoders.

55. A voice coding/decoding system as claimed in claim 50, wherein said entropy coders are Huffman decoders.

56. A voice coding/decoding system as claimed in claim 50, wherein said entropy decoders are arithmetic decoders.

57. A voice coding/decoding system as claimed in claim 50, wherein said entropy decoders are runlength decoders.

58. A voice coding/decoding system as claimed in claim 50, wherein said entropy decoders are Ziv-lempel decoders.

59. A voice coding/decoding system having a transmitting part for transmitting a coded signal of an input voice signal at a bit rate lower than a predetermined transmission bit rate and a receiving part for receiving and decoding the coded signal transmitted from said transmission part, said receiving part comprising:

demultiplexing means for receiving and demultiplexing a received signal into a codeword and a selecting signal;

switching means, operatively connected to said demultiplexing means, having an input end for receiving the codeword and having a plurality of output ends, to pass said codeword to a selected one of said plurality of output ends in response to the selecting signal;

a plurality of entropy decoders, each of said entropy decoders having inputs operatively connected to said plurality of output ends of said switching means and outputs, each of said entropy decoders having predetermined numbers of quantizer output levels and predetermined probability distributions corresponding to entropy coders in the transmission part; and a plurality of decoders each having an input, the outputs of said entropy decoders being operatively connected to the input of one of said plurality of decoders, for decoding an entropy decoded codeword, said decoders having predetermined numbers of quantizer output levels and having predetermined quantization characteristics similar to the transmission part;

whereby, in accordance with the selecting signal directing the switching means to pass the codeword to the selected one of said plurality of output ends, the transmitted codeword is decoded.

* * * * *